(12) United States Patent
Lin et al.

(10) Patent No.: US 8,923,040 B2
(45) Date of Patent: Dec. 30, 2014

(54) ACCOMMODATING BALANCE OF BIT LINE AND SOURCE LINE RESISTANCES IN MAGNETORESISTIVE RANDOM ACCESS MEMORY

(71) Applicant: Taiwan Semiconductor Manufacturing Co., Ltd., Hsin-Chu (TW)

(72) Inventors: Kai-Chun Lin, Hsinchu (TW);
Hung-Chang Yu, Hsin-Chu (TW);
Ku-Feng Lin, New Taipei (TW);
Yue-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 13/753,569

(22) Filed: Jan. 30, 2013

(65) Prior Publication Data
US 2014/0211549 A1   Jul. 31, 2014

(51) Int. Cl.
*G11C 11/00* (2006.01)
*G11C 11/16* (2006.01)

(52) U.S. Cl.
CPC .................................. *G11C 11/1675* (2013.01)
USPC ........... 365/158; 365/173; 365/148; 365/171; 365/170; 365/225.5

(58) Field of Classification Search
CPC ............... G11C 13/0069; G11C 2013/0076; G11C 2013/0078; G11C 11/5628
USPC ............... 365/18, 173, 148, 171, 170, 225.5, 365/243.5, 975
See application file for complete search history.

(56) References Cited

U.S. PATENT DOCUMENTS

| 2010/0238709 A1 | 9/2010 | Eun et al. |
| 2012/0147664 A1 | 6/2012 | Rho |
| 2012/0155146 A1* | 6/2012 | Ueda et al. ..................... 365/148 |

FOREIGN PATENT DOCUMENTS

| KR | 10-2010-0104624 | 9/2010 |
| KR | 10-2012-0063736 | 6/2012 |

OTHER PUBLICATIONS

Official Action issued Aug. 25, 2014 in counterpart Korean Patent Application No. 10-2013-0068300.

* cited by examiner

*Primary Examiner* — Thong Q Le
(74) *Attorney, Agent, or Firm* — Duane Morris LLP (57) ABSTRACT

A memory has magnetic tunnel junction elements with different resistances in different logic states, for bit positions in memory words accessed by a word line signal coupling each bit cell in the addressed word between a bit line and source line for that bit position. The bit lines and source lines are longer and shorter at different word line locations, causing a resistance body effect. A clamping transistor couples the bit line to a sensing circuit when reading, applying a current through the bit cell and producing a read voltage compared by the sensing circuit to a reference such as a comparable voltage from a reference bit cell circuit having a similar structure. A drive control varies an input to the switching transistor as a function of the word line location, e.g., by word line address, to offset the different bit and source line resistances.

20 Claims, 10 Drawing Sheets

R-I curve of MTJ model ($\tau$ = 4 ns).

FIG. 12

ACCOMMODATING BALANCE OF BIT LINE AND SOURCE LINE RESISTANCES IN MAGNETORESISTIVE RANDOM ACCESS MEMORY

BACKGROUND

This disclosure concerns circuits and methods configured to adjust the voltage applied to control a bit cell transistor that switches a read bias current through addressed magnetoresistive memory bit cell elements in a memory array, during memory read operations.

In memory arrays, bit cells can be addressed separately according to their word line addresses, and when addressed are coupled to bit positions of memory words that are input (written) or output (read). The bit cells at a given bit position, for all the word lines, occupy successive locations along the associated bit line and source line of that bit position. When the word line of a bit cell is addressed, the addressed bit cell conducts current from a biasing source, at an amplitude according to the operational and logic states of the bit cell. That current passes through a portion of the bit line to bit cell, and then from the bit cell through a portion of the source line, when conducting from the biasing current source to current sink.

Because the bit cells have different locations along the bit line and the source line, namely nearer to the far end of one or the other of the bit line and source line, the relative lengths of the bit line and source line conductors coupled in series with the bit cell differ, according to the location of the bit cell in the array. Differences in length lead to differences in the distribution of resistance in series with the bit cell, between the bit line and source line side, even if the total resistance is the same because when the bit line is relatively shorter, the source line is correspondingly longer, and vice versa.

It is advantageous to accommodate certain effects caused by differences in the distribution of resistances, particularly in magnetoresistive bit cell memories.

SUMMARY

It is an object of the present disclosure to establish circuits and techniques whereby the switching voltages applied to the gates of the bit cell transistors that select the bit cells in a memory word during a read operation are varied at least partially to offset a body effect that causes the bit cell transistor to have a biased voltage at its source and/or drain that is determined by whether the location of the bit cell in the memory array introduces more or less resistance between the bit cell and a sensing circuit, or more or less resistance between the bit cell and circuit ground. The total resistance typically is substantially constant but the distribution of resistances varies, producing a body effect that typically varies with the word line address. In an embodiment in which the word line address corresponds to relative position the in a memory array, the address can be taken into account when adjusting the voltage applied to the switching transistor. In some embodiments, the drive voltage to the switching transistors for all the bit cells along a word line is made specific to the word line address. In other embodiments, the drive voltage is specific to a block of word lines addressing bit cell MRAM elements that are nearby one another in the array. Additional embodiments are disclosed wherein the drive voltage is made variable, for example using a current level feedback control to apply the drive voltage needed to produce a given read current level, thereby accounting for the body effect without the need to account for word line address.

BRIEF DESCRIPTION OF THE DRAWINGS

Additional objects and aspects can be found in the following discussion of certain examples and embodiments, it being understood that the subject matter is not limited only to the examples and embodiments that are specifically shown and described, and the scope of this disclosure should be regarded as commensurate with the appended claims. In the drawings.

DETAILED DESCRIPTION

In an magnetoresistive random access memory (MRAM), each memory cell has a lower and a higher resistance state representing a logic value. The two resistance states differ, for example, by a hundred to a few hundred ohms, and are assumed when the magnetic field orientations of two magnetic layers are in parallel or anti-parallel (directly opposite) orientations, respectively.

The two magnetic layers are sandwiched around a magnetic terminal junction (MTJ) of magnesium oxide or the like, and comprise a fixed or "pinned" magnetic layer having a permanent magnetic field orientation, and a changeable or "free" magnetic layer having an orientation that can be switched during write operations either to align with the orientation of the fixed layer or to be directly opposite.

The magnetic state of the MTJ is set by application of a write current of appropriate amplitude and polarity, or read out by application of a read current to apply a voltage to a sense circuit, which voltage is higher or lower in the different resistance states of the bit cell. The write and read operations require a bit cell switching transistor to couple the bit cell MTJ into a circuit coupled either to a write current supply or to a sense circuit input, along a bit line for that bit cell position.

The bit cells in a memory array are arranged in rows or memory words, along address-selected memory word lines, the bit cells each occupying a point in an X-Y grid of crossing word lines and bit lines. One word line is selected at a time, by application of an enabling voltage, whereupon all the bit cells along that word line are coupled between their associated bit line and a source or drain line. For read operations, each bit cell position in the selected memory word is applied to a sense circuit. That is all the bit lines are coupled to sense circuits and the bit cell logic values for the addressed memory word are read out. For write operations, each bit line is coupled to a write current source of a selected positive or negative amplitude according to the logic value to be written into the associated bit cell position in the addressed memory word.

The bit cells in different memory words at the same bit position are located at incrementally different positions between the opposite ends of the source line and bit line of that bit position. Thus when a higher or lower word line address is selected by its associated switching transistor, there may be a relatively longer or shorter length of conductor on the source line side or on the bit line side. This should not affect the total resistance of the circuit that contains the bit cells because when the bit line is longer, the source line is shorter and vice versa.

The switching transistors are field effect transistors (FETs). The word line signal is at a logic level that does not vary with word line address. The gate voltage applied to the switching transistor is the same whether the conductive channel of the switching transistor is at a higher or lower voltage due to the position of the addressed word line between the ends of the source line and bit line. This introduces a so-called body effect, wherein the current conducted through the bit cell differs somewhat according to the position of the addressed word line between the ends of the source line and bit line, because the switching transistors at different word line positions conduct more or less vigorously.

The MTJ element has a peculiar current-voltage performance characteristic sometimes known as the "house curve," which is discussed in more detail below. The apparent resistance of the MTJ element when in its higher resistance state (RH) varies according to the amplitude of the current that the MTJ instantaneously conducts. The highest resistance RH is observed at the lowest current amplitude (namely near the peak of the house curve). Therefore, if an effect such as the body effect varies the instantaneous current level, even assuming that other aspects are equal, there will be a corresponding increase or decrease in the differential between the RH resistance of an MTJ element of a bit cell and that of a reference cell, according to various combinations of high resistance RH and/or low resistance RL states of the bit cell and reference cell.

The body effect is not large because the resistance of the source line or the bit line typically might total only 200 or 300Ω, but in view of manufacturing tolerances and other aspects, the body effect introduces a variation and that variation can result in operational problems at some logic states that limit selection rates for the product. The difference between the high and low resistances of a given MTJ range from 1.5K Ω to 3K Ω depending on current amplitude. In some memory configurations, the sense circuit compares the resistance of a bit cell MTJ element (at one of RH or RL, depending on logic value) versus the resistance of one or more reference cell MTJ elements that likewise are at one of RH and RL. Due to variations including manufacturing variations in addition to the bit cell body effect, the differences between the MTJ resistances in different logic states of the bit cell and the comparison reference cell may be marginal in some states. It would be advantageous to have a robust difference in resistance in general, and in particular to reduce or eliminate the contribution of body effect to the resistance of MTJ elements that happen to be in the RH high resistance state.

Figure 1:
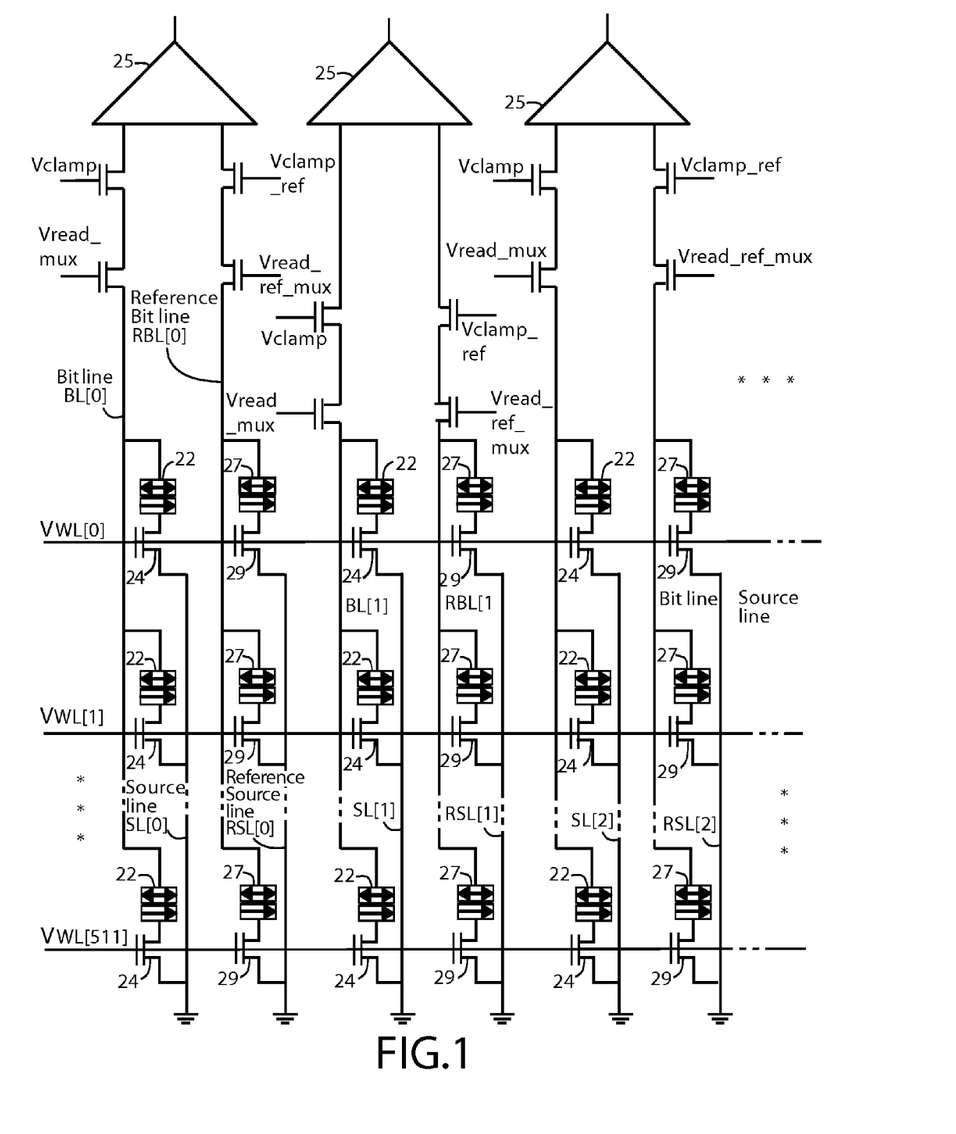
FIG. 1 is a schematic diagram of a magnetoresistive random access memory (MRAM) memory array configured with bit cells having two magnetic terminal junctions, selected by applying an enable signal to a selected word line, and coupled to sensing circuits at each bit position.

Referring to FIG. 1, in a magnetoresistive random access (MRAM) memory bit cell array, the bit cells 22 typically are arranged in an X-Y grid at the crossings of word lines WL[n] and bit lines BL[n]. A word line signal VWL[n] selects one row of memory cells in the array during a memory read operation.

Each bit cell 22 in the selected word line row is coupled by a bit cell switching transistor 24 in series with a bit line BL leading to an input of a sensing circuit 25, and a source line SL leading from the bit cell 22 to circuit ground. The bit cell switching transistor 24 couples a bit cell 22 between the bit line BL[n] and the source line SL[n]. This connection occurs higher or lower along the bit line and source line, depending on the position of the associated word line WL[n] in the array, i.e., higher or lower in the array shown in FIG. 1. Although the total length of the conductor through the bit cell transistor 24 and the bit cell 22 is the same regardless of position, more or less of that total is along the bit line BL in series between the sensing circuit 25 and the bit cell 22, or along the source line SL in series between the bit cell 22 and ground, as a result of the position of the word line WL[n] in the array.

The sensing circuit 25 distinguishes whether the bit cell 22 is in a high resistance RH state or a low resistance RL state by comparing the voltage produced across the bit cell 22 at a given read bias current versus a reference voltage. The result of the comparison is an output logic value from the read operation. For example, the sensing circuit 25 can apply a read-bias current of a given amplitude to a bit line BL, switched on by a Vclamp signal to a switching transistor for clamping and enabled when the bit line is addressed by an addressing read_mux signal.

The sensing circuit 25 is generally shown schematically as a voltage comparator in FIG. 1, the output of which determines whether the resulting voltage across the bit cell 22 is higher or lower than a reference voltage produced by a reference bit cell 27 switched between a reference bit line RBL[n] and a reference source line SBL[n]. The reference bit cell 27 mirrors the operation of the bit cell 22 except that the resistance state RH or RL of the bit cell 22 is an arbitrary value representing the logical bit value stored in the bit cell 22 whereas the resistance state of the reference bit cell 27 is known.

A reference voltage might be chosen as a voltage that is between the characteristic voltages produced by comparable data and reference bit cells in their RH and/or RL states. Among other techniques, a reference voltage can be provided by applying a read-bias current of the same amplitude to one or more reference MRAM bit cell elements in known high and/or low resistance states, providing reference voltages that are compared to the voltage on the bit line, for distinguishing whether the bit cell is in its high or low resistance state.

There is some complication possible because it may be necessary to compare the voltages obtained in different resistance states in order to conclude whether the bit cell is actually in its high or low resistance states. For example, a situation may arise wherein the reference bit cell resistance is lower than the RH resistance of the bit cell and also higher than the RL resistance of the bit cell, and vice versa, producing indeterminate results by way of direct comparison. That situation can be addressed, for example, by making multiple comparisons wherein the state of one or both of the bit cell 22 and reference bit cell 27 is first compared with the other, then a known resistance state is set, and an additional comparison made. Nevertheless, for purposes of illustration in this disclosure and to avoid undue complication, the reference bit cell 27 is shown with an MTJ element and circuit arrangement that simply mirrors that of the bit cell 22. It should be understood that this is merely exemplary and that various techniques are possible such as using a one or more given voltage amplitudes for bias or for comparison, comparing resulting voltages, currents or current discharge rates, and steps of reading and writing states to and from the bit cell 22 and one or more reference bit cells 27, to discern whether the bit cell 22 is in fact in its RH or RL state when read out.

Figure 2:
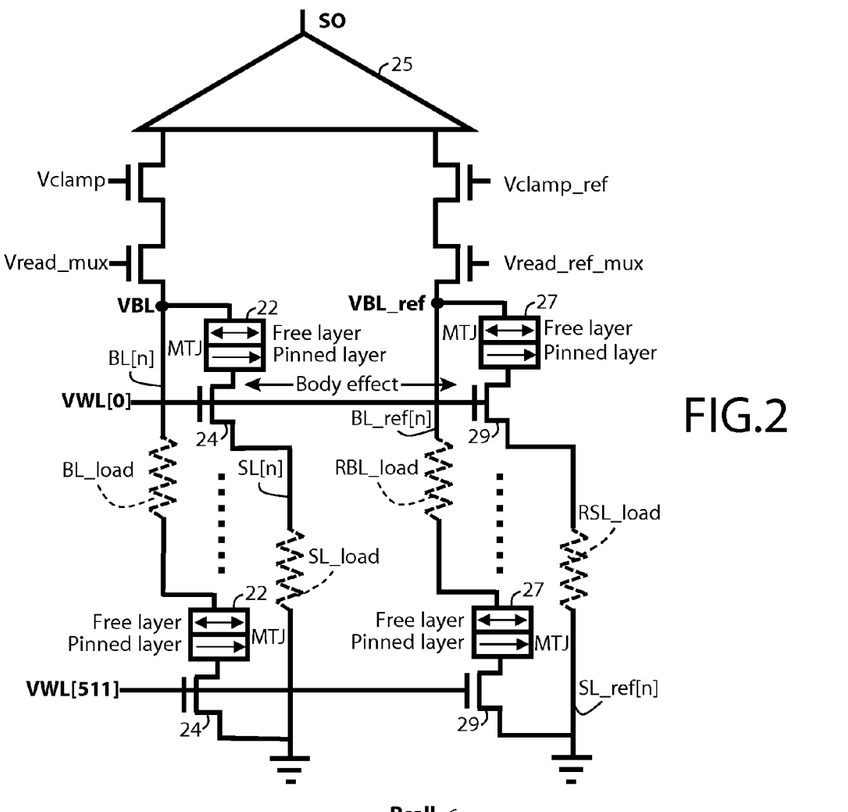
FIG. 2 is a schematic diagram corresponding to FIG. 1, showing one bit position and a span of word lines between minimum and maximum word line addresses (in this example zero to 511).

FIG. 2 shows the arrangement seen in FIG. 1 but only for one bit position and only for the lowest and highest word line positions WL[0] and WL[511] in this example. The resistances of MRAM bit cells 22 and reference bit cells 27 vary as a function of high or low resistance due to the antiparallel or parallel orientations of the magnetic fields in the magnetic layers (a free or changeable layer, and a pinned or fixed-orientation layer) sandwiching the magnetic terminal junction (MTJ). Changing the orientation of the free layer (shown as a double-headed arrow) changes the resistance state of the bit cell 22 (or the reference bit cell 27).

Over the population of all the MTJ elements in a memory array, the resistances of the bit cells in either of their RH and RL resistance states vary from one bit cell (or reference cell) to another, due for example to manufacturing variations such as variations in the thickness of the MTJ between the magnetic layers. The cell-to-cell variations in a memory array have a statistical distribution. Although each individual memory cell has distinctly higher and lower resistances in its two states, the lower resistance value of some cells may be close to the higher resistance value of other cells and vice versa. When the high resistance RH of some cells is close to the low resistance RL of other cells, the measurement differential for distinguishing between high and low resistances is correspondingly reduced.

Even if the high resistance values are all approximately equal among the bit cells and the reference cells, and the low resistance values likewise are approximately equal among such cells, it is advantageous to avoid introducing other variations that detract from the extent to which the sensor circuit can distinguish between high and low resistance states by comparing the voltages that are produced on the bit lines BL[n] and reference bit lines BL_ref[n]. In other words, it is advantageous if the only resistance effect that is contributing to the voltage at the input to the sensing circuit 25 is the difference in resistance of the bit cells and reference bit cells in their RH and RL resistance states.

Figure 3:
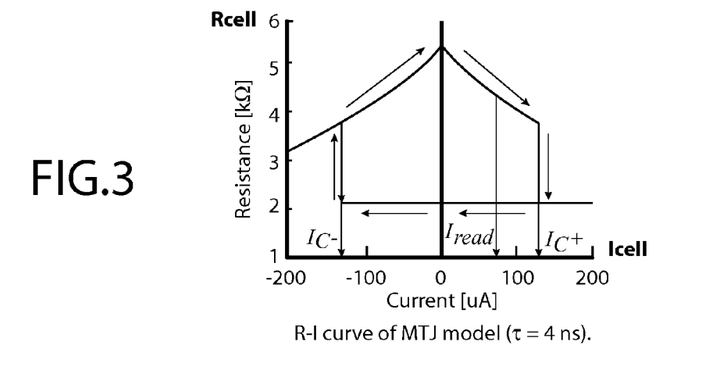
FIG. 3 is an graph showing an exemplary MRAM voltage/current characteristic, demonstrating two distinct resistance states that can be switched by applying a write current of required polarity and at least a characteristic write current amplitude, or read out by applying a read current of either polarity and an amplitude less than the write current amplitude.

FIG. 3 is a plot of resistance versus current for an exemplary MRAM MTJ element. This plot is the so-called house diagram due to the peaked upper part of the plot. It can be seen that in the low resistance RL state, the cell has a substantially constant resistance (measured serially through the free layer, MTJ and pinned layer) regardless of current, in this example about 2K Ω. In the high resistance RH state, a maximum resistance of the MTJ element occurs when the current amplitude is near minimum. The resistance is about 1.2K Ω lower at maximum current amplitude at either of two polarities, where operation forces the free layer of the MTJ element to change between parallel and antiparallel alignments, thereby switching the MTJ element into its other resistance state. The MTJ element complies of course with Ohm's law, V=IR. Therefore, in the high resistance state RH, a difference in current amplitude produces a different voltage across the MTJ element, due not only in proportion to the current but also because the MTJ element's resistance varies with the slope of the peak of the house diagram.

Each addressable bit cell 22 is coupled to a switching transistor 24 associated with the corresponding word line WL[n] and the bit position BL[n] of that bit cell in the in array. When the word line is selected by applying a level VWL[n] to the word line, the associated bit cell 22 is coupled directly between the bit line BL[n] and the source line SL[n] that leads to ground, thereby placing the resistance of the addressed bit cell 22 between the input to the sensing circuit 25 and ground. However based on the location of the bit cell in the memory array, the length of the conductor extending between the sensing circuit and the bit cell may be longer or shorter than the length of the conductor extending from the bit cell to the circuit ground. The resistances BL_load of the bit line and SL_load of the source line conductors are shown in FIG. 2 as broken line resistors.

The distribution of these two conductor lengths, namely the effective lengths of the bit line from the sensing circuit to the bit cell, and the source line from the bit cell to ground, typically varies with the memory address of the bit cell. The bit cells on high numbered word lines may be coupled by a short conductor to ground and by a long conductor to the sensing circuit (or vice versa) and the bit cells on low numbered word lines have the opposite situation. In FIG. 2, the highest and lowest word line addresses are compared, and the entire conductor resistance between the mux and clamp transistors and ground is on the sensor side for WL[511] and on the ground side for WL[0]. For intermediate word lines, the balance of resistances on the sensor side and on the ground side vary in inverse relation to one another.

One might expect that the location of a bit cell between high and low numbered word lines should not affect the voltage at the input to the sensor 25 because the voltage applied at the input to the sensing circuit is determined by the product of the current amplitude from the source, and the total resistance between the sensing circuit and ground (V=IR). That total resistance includes the bit cell resistance plus the active portions of both the bit line (from the sensor to the bit cell) and the source line (from the bit cell to the source). When the bit cell location is such that the bit line is short, then the source line is correspondingly long, and vice versa. The sum of the bit line and source line resistances should be approximately equal, provided that the bit line and the source line have corresponding material and cross sectional size, because the sum of their conductor lengths is the same regardless of the location of the bit cell in the memory array. The sum of the bit line and source line resistances might be, for example 200 or 300Ω.

However a so-called body effect introduces a difference in current amplitude conducted through the bit cell during a read operation. The voltage applied to the gate of the switching transistor 24 that couples the addressed bit cell 22 between the bit line BL and the source line SL is a constant voltage. But the voltages at the source and drain of the switching transistor 24 vary with the word line location of the addressed bit cell in the memory array. As a result of the gate voltage varying relative to the source and drain voltage with bit cell location, the switching transistor is driven at different amplitudes to conduct when the resistances of the bit line and source line, although constant when summed, are balanced more toward greater resistance between the bit cell and ground (such that the source and drain of the bit cell are at a higher voltage compared to the gate drive voltage) or more toward the sensing circuit (such that the source and drain are at a lower voltage).

FIG. 3 shows that a difference in current amplitude likewise produces a difference in the resistance of bit cell 22 when in the high resistance RH state. The sensing circuit needs to distinguish between bit cell resistances (in RH or RL states of a bit cell) that may be only slightly different from one another and from reference resistances in RH and/or RL states. According to an aspect of the present disclosure, the ability of the sensing circuit 25 to distinguish RH and/or RL states of addressed bit cells during read operations is improved because the body effect and the difference in relative resistances of the bit line and source line are removed as a source of variation in the voltages applied to the sensing circuit, or at least their contribution is minimized.

Referring to the house diagram in FIG. 3, and assuming a memory array of 511 word lines, the current level Icell through the bit cell 22 according to Ohm's Law is the voltage at VBL divided by the sum of resistances to ground. In the low resistance state:

$$I_{Cell_{RL}} = \frac{VBL}{R_{BL\_load} + R_{SL\_load} + R_{Cell\_RL} + \Delta RB}$$

Where $\Delta RB = \Delta R_{Body\_effect} \times (511-n)WL$ $n = 0 \sim 511 WL$ $R_{BL\_load} + R_{SL\_load} = \text{Constant}$ In the high resistance state, the current level is affected by the operating point along the sloping peak of the house diagram:

$$I_{Cell_{RL}} = \frac{VBL}{R_{BL\_load} + R_{SL\_load} + (R_{Cell\_RL} \times A) + \Delta RB}$$

Where $\Delta RB = \Delta R_{Body\_effect} \times (511-n)WL$ $A = \text{slope of } R_H \text{ vs. } Icell$ $n = 0 \sim 511 WL$ $R_{BL\_load} + R_{SL\_load} = \text{Constant}$ The effect of these relations is that when n is near zero or near the maximum word line count (511 in the example), the effective loading introduced by the bit line and source line conductors is different due to the body effect. The body effect is biggest for bit cells near to VBL because more resistance is disposed between the bit cell and ground, and the gate voltage is relatively weaker when applied to render the switching transistor 24 conductive. As the address n increases (namely for bit cells near to VBL), the cell resistance appears to be larger, leading to a smaller current amplitude Icell, which reduces the margin or differential between resistance states at the input(s) to the sensing circuit.

As shown in the house diagram of FIG. 3, the bit cell resistance at RL does not vary with current amplitude. The body effect is present and has varies the current amplitude at RL for different WL addresses. But the variation at RL is less than the variation at RH, where not only the body effect but also the slope of the house diagram contribute to increase the resistance and decrease the current amplitude through the bit cell 22. The margin of difference in input voltages to the sensor 25 at in RH and RL states is decreased. FIG. 2 shows that in an embodiment wherein a reference bit cell 27 provides the input voltage VBL_ref to the sensor 25 for comparison against the voltage VBL from bit cell 22, the margin of difference applies to both the bit cell and the reference bit cell.

Figure 4:
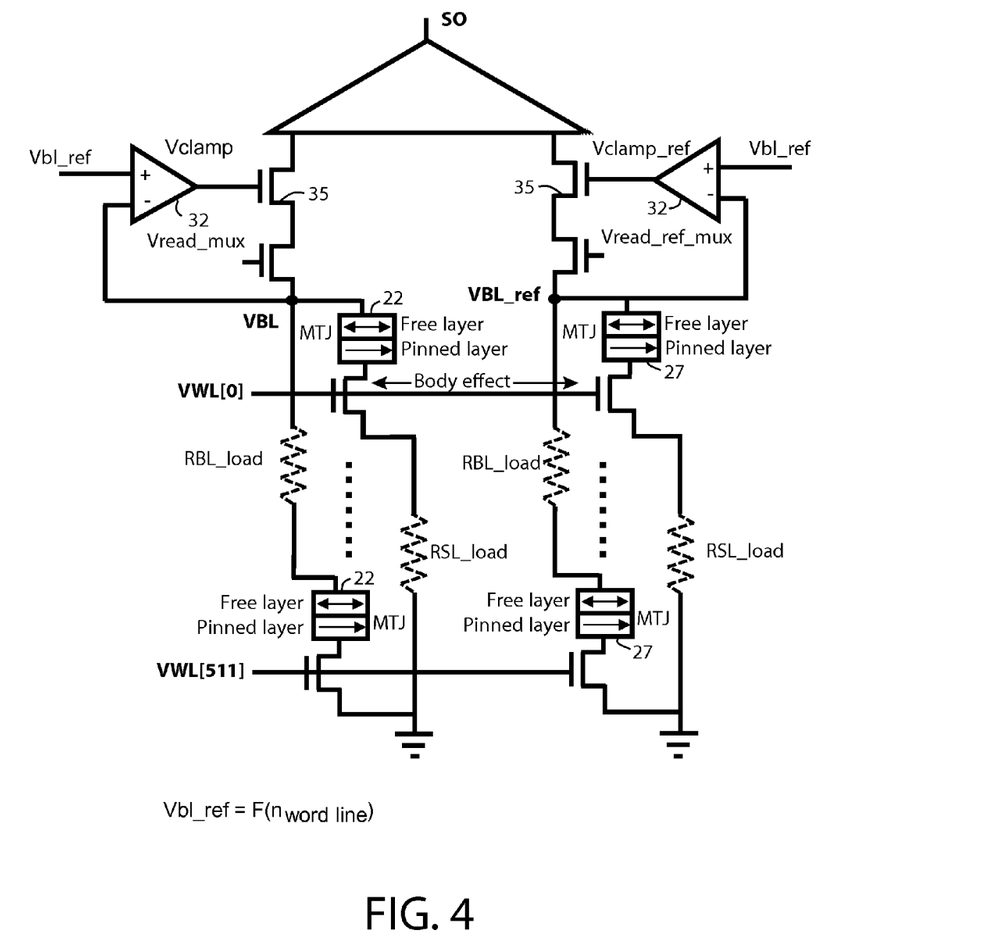
FIG. 4 is a schematic diagram corresponding to FIG. 2 and additionally including a current control circuit operable to apply a fixed read current amplitude to a bit cell as determined by a Vbl_ref voltage. The fixed read current is applied to the subject bit cell and the reference bit cell to which the subject bit cell is compared.

FIG. 4 demonstrates an embodiment wherein the body effect contribution is reduced or eliminated by providing drive circuits for the bit cell and reference bit cell that tend to cause the current bias on the memory bit cells 22 and reference bit cells 27 to be equal for all word line positions. Follower amplifiers 32 have a non-inverting input coupled to a control signal Vbl_ref and an inverting input coupled to VBL or VBL_ref in a feedback path. The amplifiers 32 are high gain differential amplifiers and in this configuration drive the output voltages Vclamp and Vclamp_ref to follow the input voltage Vbl_ref. In one embodiment, the control voltage Vbl_ref is determined as a function of the word line address.

Accordingly and as shown in FIG. 4, a magnetoresistive memory apparatus is provided, including plural bit cells 22, 27, each bit cell having at least one magnetoresistive element MTJ characterized by different resistances in different logic states of the bit cell. Each such bit cell 22, 27 occupies a bit cell position in a memory array having plural memory words WL[0] to WL[511], each memory word WL[n] being addressable by a word line signal VWL[n] during a memory access operation involving one of reading from and writing to bit cells in the memory word.

A read-write circuit is provided for each bit position along the memory word, the read/write circuit having one of an input and an output coupled to a bit line BL. The bit cell 22, 27 is coupled between a bit line BL and a source line SL by at least one switching transistor 24, 29 when the bit cell is addressed during the memory access operation. The relative lengths of the bit line BL and the source line SL vary oppositely as a function of a location of the bit cell in the memory array. In the embodiment shown, the bit line and source line extend between inputs to a sensing circuit 25 and ground, and the switching transistor 24, 29 for a bit cell 22, 27 couples the bit cell between the bit line BL and source line SL at one of a number of locations that vary along the bit line BL and source line SL as a function of the word line address WL[n].

A drive control 32 is coupled to vary an input Vclamp to at least one transistor 35 in series with the bit line BL. In one embodiment, the drive control is configured to customize the voltage applied to the bit line BL, namely the voltage at nodes VBL and VBL_ref, as a function of word line address that is being invoked in the read operation. This technique is used to reduce or eliminate the variations in resistance of the bit line and the source line that occur when the bit cell is in its high resistance RH state, due to the body effect and due to the characteristic slope of the house diagram with respect to resistance versus bias current.

Figure 5:
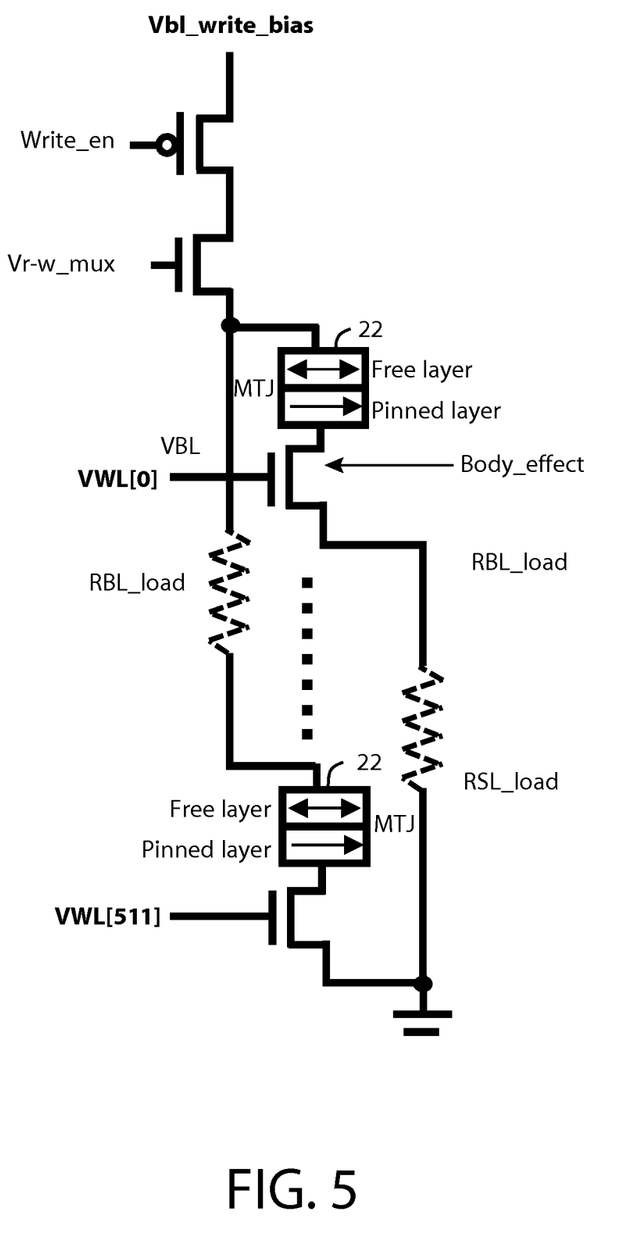
FIG. 5 is a schematic diagram corresponding to FIG. 2 but configured to show application of a write current determined by a Vbl write bias input.

In the illustration of FIG. 4, the memory access operation is a read operation and the input to the switching transistor 35 is adjusted to account for a slope of an RH-ICELL characteristic of the bit cell that arises differences in read current biasing due to the body effect. FIG. 5 shows that the body effect also applies in the case where the memory operation is a write operation. According to the house diagram, the bit cell 22 can be forced into its high resistance RH or low resistance RL state by applying a bias current of the required polarity and a sufficient write current amplitude. As the bias current applied to the bit cell 22 is increased (in either polarity), the resistance of the bit cell falls off according to the slope of the house diagram, provided that the bit cell is in the high resistance RH state, the reduction of resistance leads to added current if the applied voltage is the same. As shown in FIG. 5, a control input voltage applied to the Write_en input can be used adjust the write current bias according to the word line address WL[n], to reduce or offset the current variation, particularly when writing from state RH to RL.

Returning to the control of read current bias during read operations as shown in FIG. 4, the process of reading out the logic level of the bit cell 22 can involve a comparison by the sensing circuit 25 to determine whether the resistance of bit cell 22 is higher or lower than the resistance of a reference bit cell 27. The comparison may involve a number of steps such as comparing to determine whether the resistance of bit cell 22 is higher (or lower) than the resistance of the reference bit cell 27, then writing a known resistance state to one of the bit cell 22 and the reference bit cell 27, and then making further comparison to determine whether the results of the comparison have changed.

Such steps may be needed because the high resistance RH of the bit cell, for example, maybe a lower resistance than the high resistance RH of the reference bit cell. In such a case, a simple comparison of the resistances of the bit cell and reference bit cell does not require one to conclude that the bit cell 22 is in its low resistance state RL, even if it is known that the reference bit cell is in its high resistance state RH and the comparison shows that the bit cell resistance is lower. By comparing resistances under read bias current conditions, and writing known states to the bit cell and/or reference bit cell, one can arrive at a conclusion regarding the original logic value stored in the bit cell 22.

A reference bit cell 27 is provided in this embodiment at each word line address WL[n] corresponding to the word line address of bit cells 22 in the memory word. The sensing circuit is arranged to compare and discern one of an RH state and RL state from a comparison of resistances of the bit cell and the reference bit cell. Inasmuch as the reference bit cells 27 and the data bit cells 22 are compared in the same word line rows WL[n], the control arrangements for both the data and reference bit cells include a corresponding amplifier 32 with a control input level coupled to the same Vbl_ref control signal.

Figure 6:
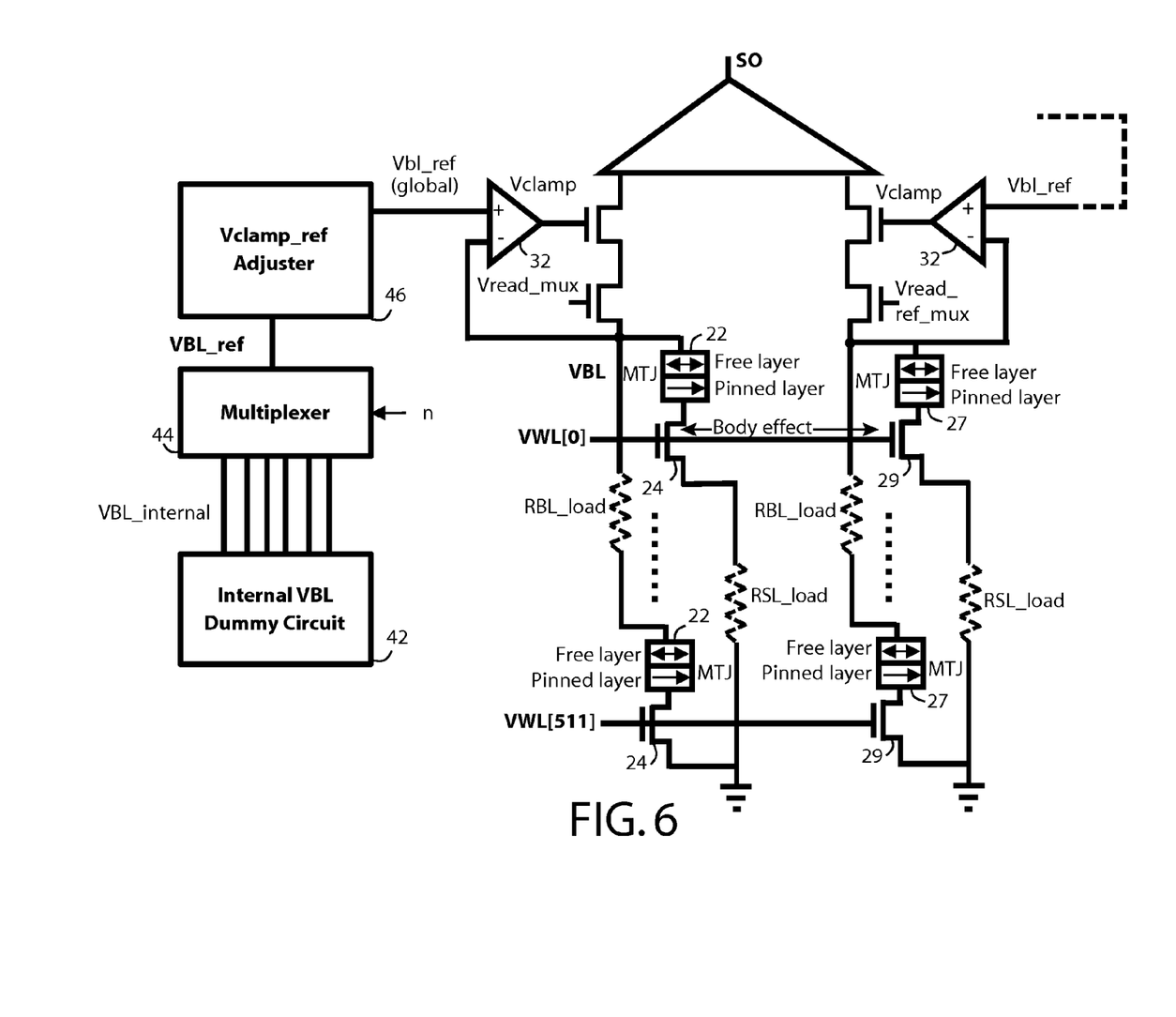
FIG. 6 is a schematic diagram showing selection of a Vbl_ref voltage as a function of the word line address, to obtain a read current that is equal for any addressed bit cell regardless of the location of the bit cell between the minimum and maximum word line addresses in a multiplexed manner from a dummy circuit capable of producing incrementally different Vbl_ref voltages.

FIG. 6 illustrates and embodiment wherein the control signal Vbl_ref used for both the bit cells 22 and the reference bit cells 27 is generated as a value that is specific to the word line address and thus substantially compensates for the body effect so as to produce equal bias and comparison conditions for bit cells and reference bit cells regardless of their word line number n. As discussed, the bit cells 22 in the respective memory words are located at successive locations along the generally coextensive bit line BL and source line SL conductors. The switching transistors 24 for each said bit cell couples the bit cell 22 between the bit line and the source line at one of the successive locations, thus introducing the body effect due to allocation of the total resistance more or less on the bit line or source line side. In this embodiment, the reference bit cell is at the same word line position WL[n] and therefore has the same allocation of resistances between the bit line and source line side. The same control signal Vbl_ref is used as the input to the two follower amplifiers 32 that offset the body effect according to a relative location of the bit cell 22 and reference bit cell 27 along the successive locations.

In FIG. 6, the control signal Vbl_ref is generated specifically to account for the word line address of the active word line WL[n]. A same Vbl_ref signal is applied using a dummy circuit 42 that provides plural IR drop reference levels. A particular reference level is selected by a multiplexer 44 associated with the signals that address a word line WL[n] and enable read and write operations. The VBL_ref level selected as appropriate in view of the word line address n is applied to the two follower amplifiers 32 by a Vclaim_ref adjustment element 46.

Figure 7:
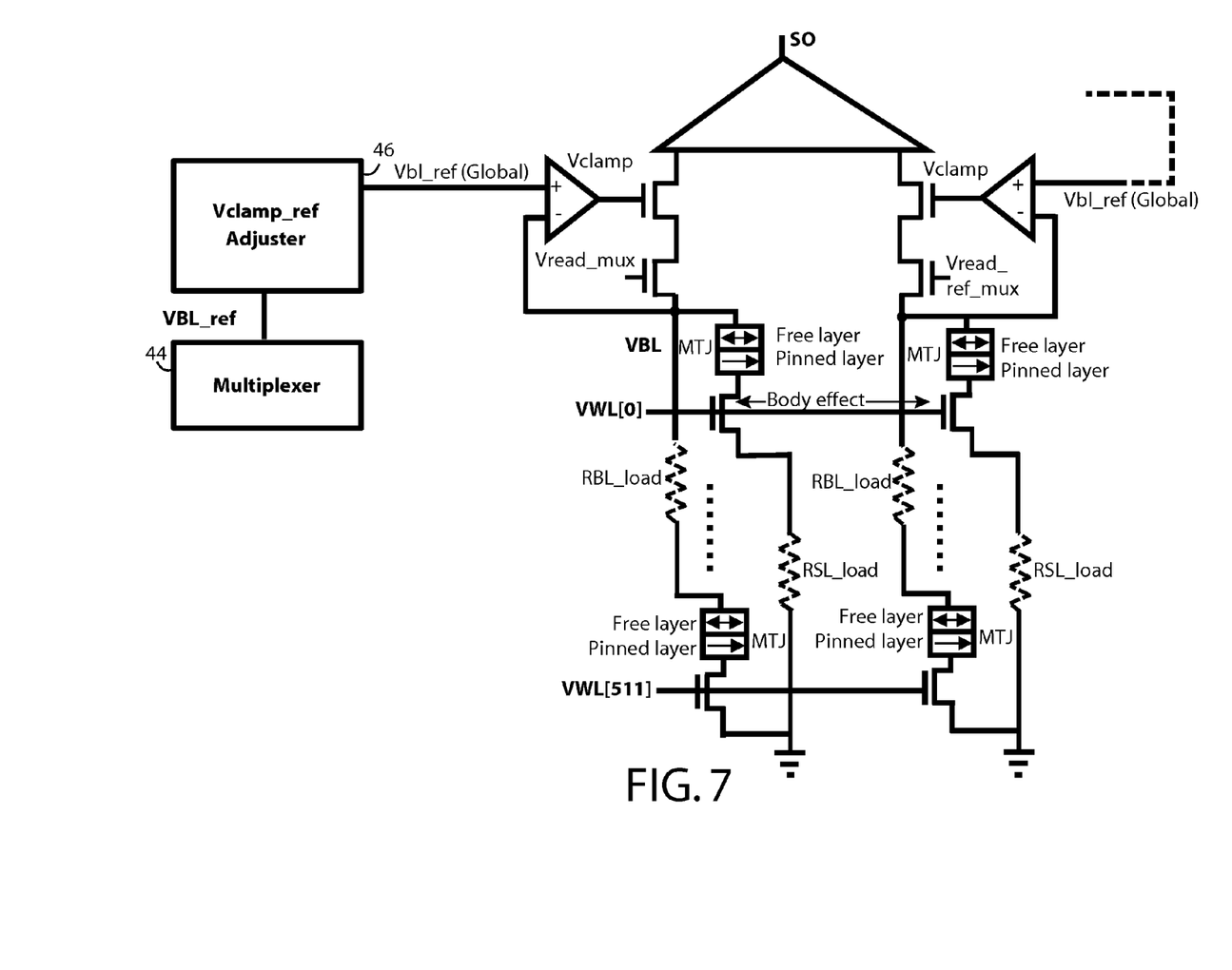
FIG. 7 is a schematic diagram with a multiplexer generally controlling a level of Vbl_ref.
Figure 8:
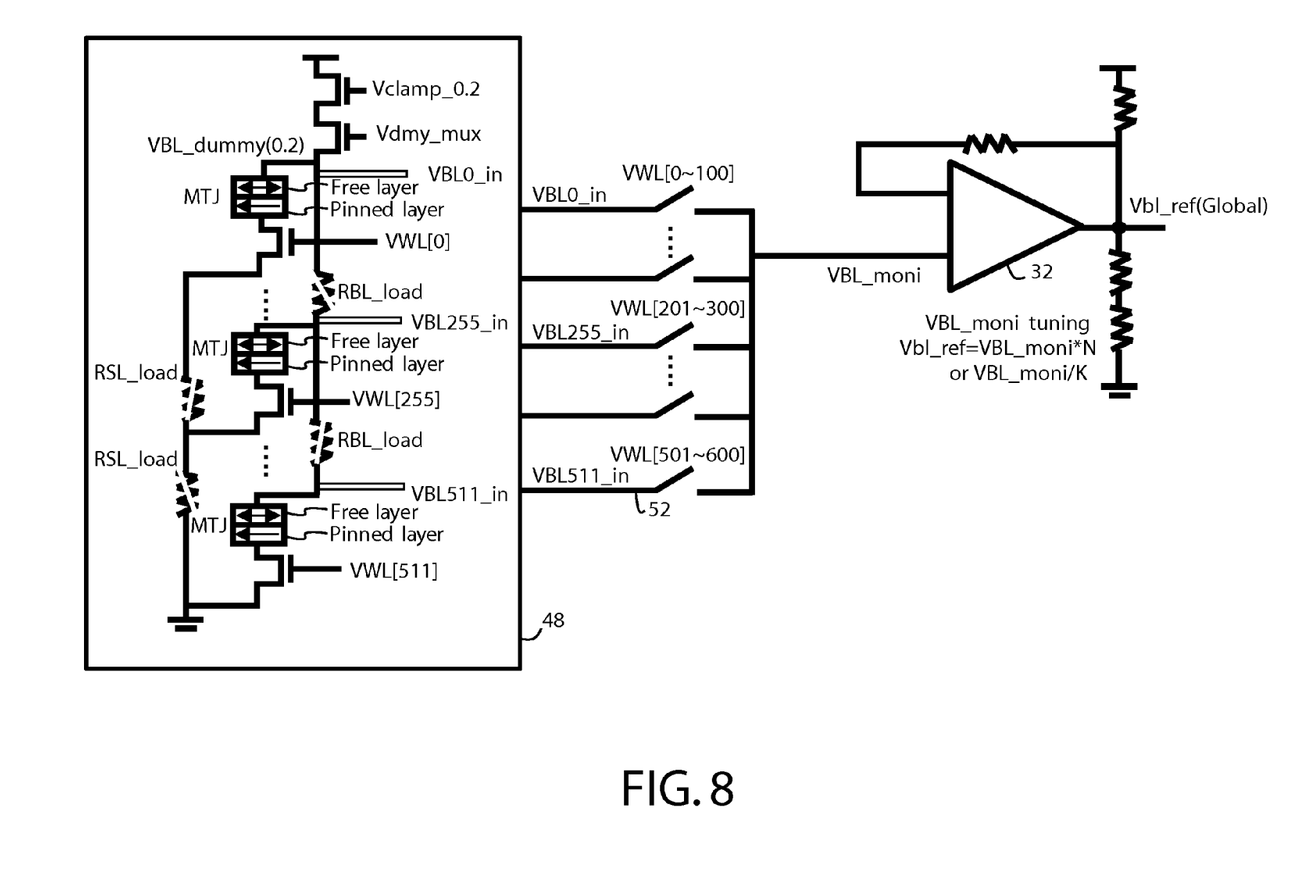
FIG. 8 is a schematic diagram showing the selection of a Vbl_ref voltage as a function of the word line address of an addressed bit cell, in particular a bit cell within one of several possible ranges of word line addresses.

FIG. 7 illustrates an alternative embodiments wherein a tuning or trimming level is generated in the Vclamp_ref adjuster 46 based on an output of multiplexer 46 that varies with word line address. In this way, the drive control applied to the follower amplifiers 32 comprises drive voltage adjustment circuit 46 responsive to a word line address. There are some alternative specific embodiments for how the tuning or trimming signals are obtained, one example being a dummy circuit 48, shown in FIG. 8, containing a bit line, source line and set of switching transistors that match the operation of the bit cells 22 and reference cells 27 in the addressed word line WL[n]. In the example of FIG. 8, not every word line in the dummy circuit 48 provides a distinctly different control level VBL[n]. Instead, the control levels are provided to encompass a range of word line addresses. In this example, one hundred word line addresses are encompassed by dummy circuit levels, e.g., with the dummy level VBL[255] being selected by a crossover switching matrix 52 when word lines 200 through 300 are selected, etc. In FIG. 8, five dummy levels from a dummy circuit 48 are used in ranges of about 100 word lines selected by switch matrix 52, but other specific arrangements are also possible with two or more selectable control levels up to a potential maximum number equal to the number of addressable word lines (or 511 in the embodiment shown).

In the foregoing embodiments, the drive voltage adjustment circuit for counteracting the body effect a variable voltage source coupled to the follower amplifier, such as the bit line voltage dummy circuit of FIG. 8, wherein a bit line voltage dummy circuit produces a plurality of control voltages with a switching circuit selecting among the plurality of control voltages, thus forming a variable voltage source for tuning the current bias to the bit cells 22 and reference bit cells 27.

Figure 9:
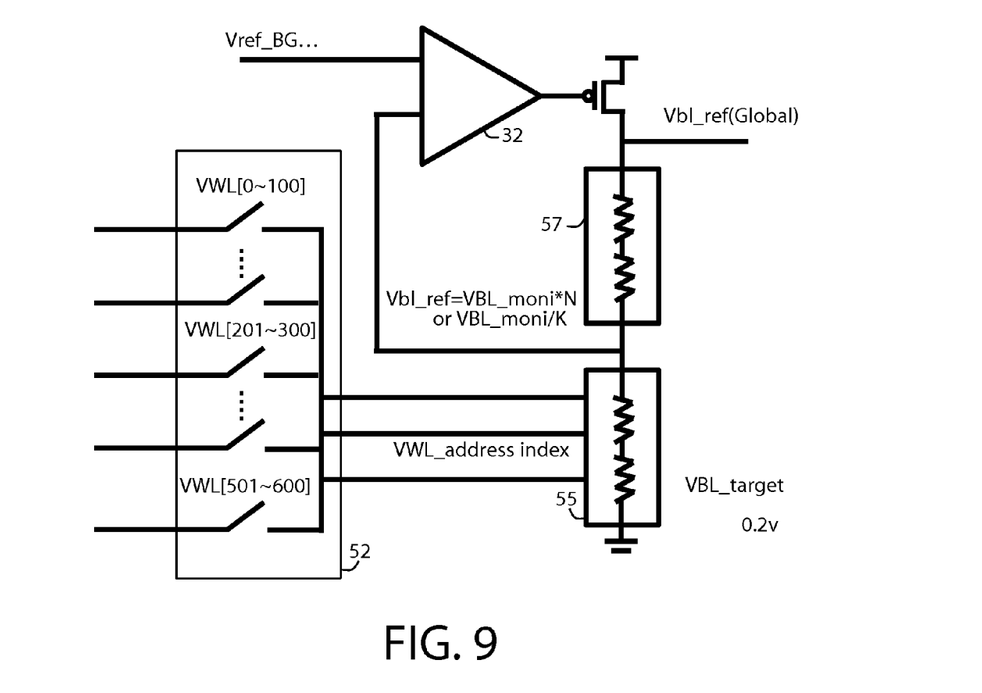
FIG. 9 is a schematic diagram that enables control of a read current by adjusting the voltage on the ground side of a bit line.

FIG. 9 schematically illustrates an alternative embodiment wherein a switching matrix 52 selects an appropriate amount of serial resistance to be coupled in parallel with the current supply and its resistance 57, once again in order to compensate for the variation in resistance of the bit cell 22 and reference bit cell 27 in the addressed word line WL[n] due to the body effect and the slope of the resistance-current house diagram discussed above. As in the embodiment of FIG. 8, wherein a plurality of control voltages are assigned to word lines in banks having neighboring word line addresses, whereby the word lines in each of the banks are subjected to the same one of the plurality of control voltages when selected by a word line address signal, the embodiment of FIG. 9 has a plurality of selectable resistances, assigned to word lines in banks having neighboring word line addresses. Likewise, the appropriate bank and resistance are selected when a word line address in a given range is selected during a memory access operation.

Figure 10:
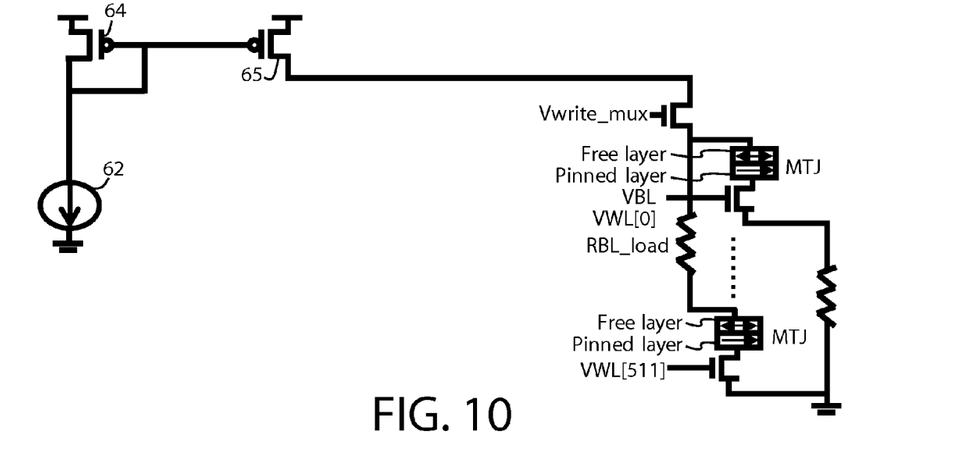
FIG. 10 is a schematic showing that write current can be controlled in a manner similar to controlling a read current using Vbl_ref but wherein the input control signal is generated by a current mirror reference.

As mentioned above, the disclosed techniques are applicable to correcting for the body effect when attending to read operations in which voltage or currents are compared by a sensor circuit, and also to write operations in which an appropriately robust current level is applied to write a bit cell 22 or reference bit cell 27 into its high or low resistance state RH or RL. In write operations, an object is to apply a sufficient current. A circuit and technique shown in FIG. 10 are useful to ensure a sufficient current without regard to the body effect, and without the need to tune the driving circuit as a function of word line address. A current reference 62 is coupled in one leg of a current mirror comprising two transistors 64, 65. The current mirror seeks to apply the same current amplitude to the bit line conductor BL as conducted by the reference source 62. It may happen that the body effect due to the variation in addressed word lines produces a variation in the series resistance of the bit line to source line conductive path through the addressed bit cell.

However, the current write amplitude is made to match the reference current source 62 and thus if the resistance of an addressed bit cell is higher (or lower) due to the body effect, the drive circuit will produce a higher (or lower) voltage at Vwrite_bl_bias and thereby offset that variation. The write current drive control, comprising a current mirror circuit coupled to a reference current source 62, is a form of feedback current control configured to establish a nominal drive current amplitude in the bit line of the addressed bit cell substantially independently of the relative location of the bit cell along the successive locations. This arrangement thereby resembles the read current bias controls discussed above, wherein a voltage adjustment is made to achieve a nominal read current amplitude with little or no variation due to differences in word line addresses and associated body effect considerations.

Figure 11:
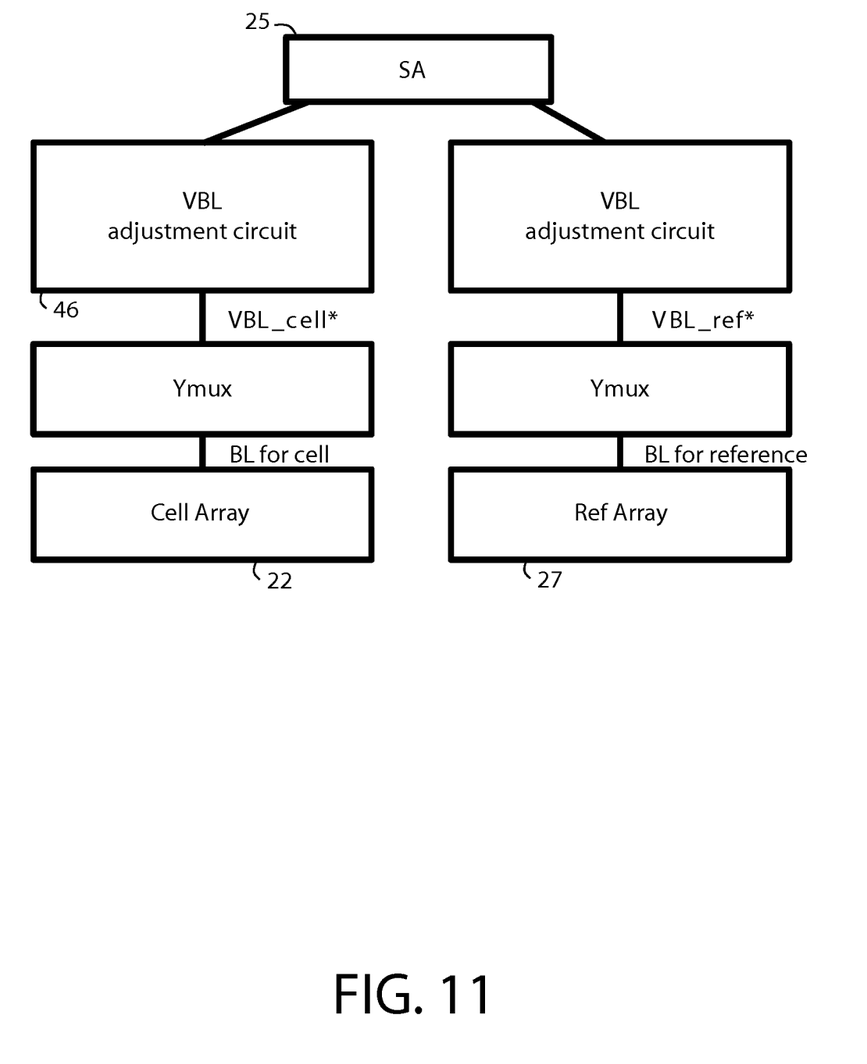
FIG. 11 is a block diagram showing the major elements of the disclosed apparatus.

FIG. 11 is a block diagram showing the primary elements of the disclosed subject matter in the embodiments using bit cells and reference bit cells for comparison with read current bias adjustment. The voltage VBL is caused to vary when accessing different word line addresses WL[n] to cancel bit line BL resistance loading. For example where the bit line BL loading is greater, VBL is cause to have a larger amplitude. When BL loading is smaller, the VBL amplitude is smaller. By reducing or eliminating the effect of variation in BL loading, the sense circuit 25 is more effective because the difference between resistances that are effectively compared is due to the resistance states RH or RL of the bit cells and reference bit cells, and not due to bit line and source line loading that is subject to the body effect.

Figure 12:
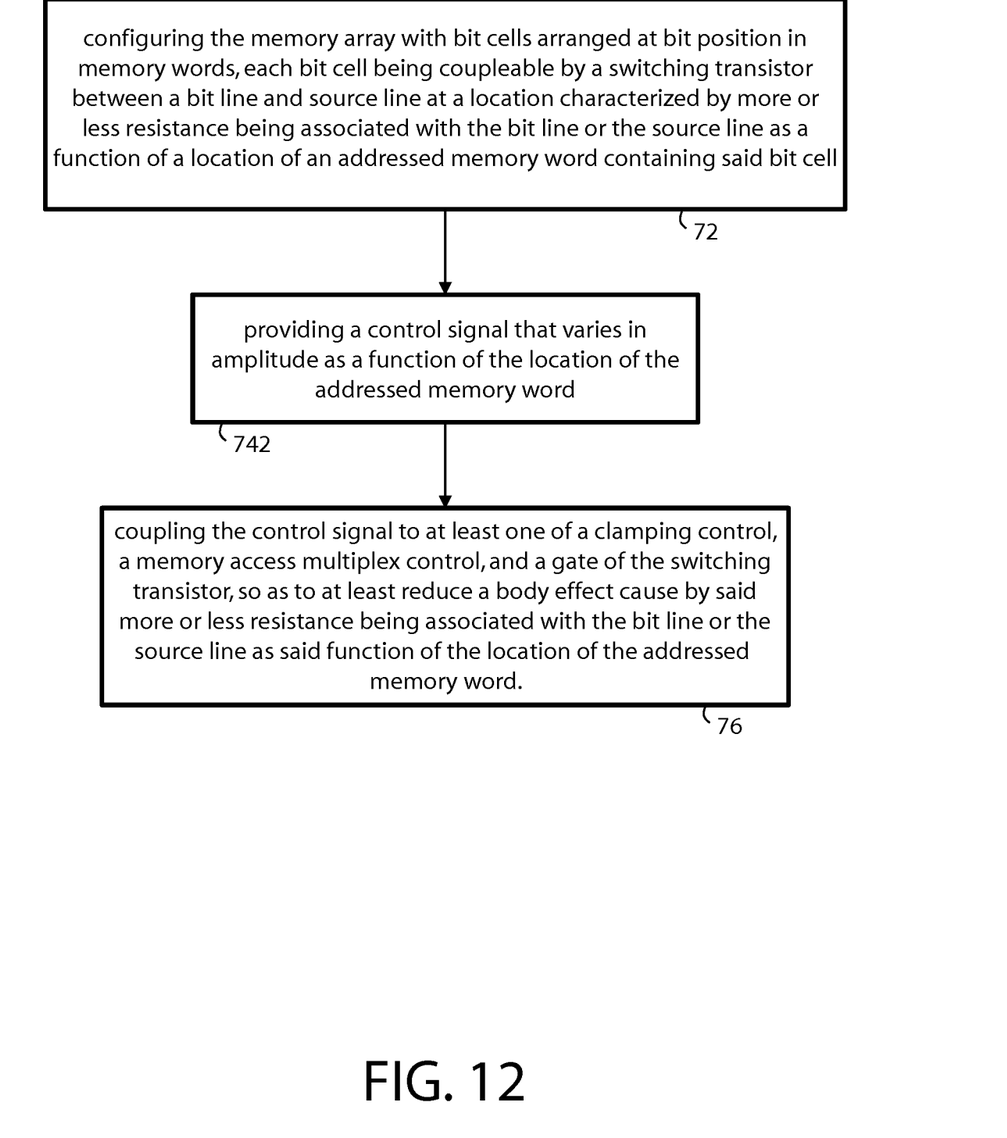
FIG. 12 is a flow chart showing accessing bit cells in a memory array wherein the bit cells have distinct resistance levels representing logic states.

The disclosed subject matter can be regarded as a method, shown in FIG. 12, for accessing bit cells in a memory array wherein the bit cells have distinct resistance levels representing logic states. The method at step 72 includes configuring the memory array with bit cells 22, 27 arranged at bit positions in memory words, each bit cell 22, 27 is coupleable by a switching transistor 24 between a bit line BL[n] and a source line SL[n] at a location characterized by more or less resistance BL_load being associated with the bit line or SL_load with the source line as a function of a location of an addressed memory word containing the bit cell. The location can be a matter of the word line address "n" between maximum and minimum word line addresses.

At step 74, a control signal is provided that varies in amplitude as a function of the location of the addressed memory word. By coupling the control signal to at least one of a clamping control, a memory access multiplex control, and a gate of the switching transistor, at step 76, the body effect caused by such more or less resistance being associated with the bit line BL_load or the source line SL_load due to the location of the addressed memory word, is reduced or eliminated.

As discussed above, the control signal can be derived from a numeric value of an address of the memory word WL[n]. That arrangement permits the control signal to be specific to the word line address and of an amplitude adapted specifically for the particular word line being addressed. Alternatively, the control signal can be more generally adapted to the word line being addressed, for example being an appropriate amplitude on average for a range of neighboring word line addresses. The controlled amplitude can be a voltage that generates a bit line bias current or the current itself can be controllable. For example, the control signal can be derived from a variable voltage control having one of a current mirror (e.g., FIG. 10) and a feedback control leg (e.g., FIGS. 4, 6, 7) in either case operable to maintain a predetermined current characteristic through the addressed bit cell, or at least to adjust the current level to reduce the body effect on the bias current amplitude that otherwise would be maintained when reading or writing to the bit cell 22, i.e., reading out a high low resistance state, or imposing a high or low resistance state RH or RL.

As shown in FIG. 8, a technique for obtaining a control signal for adjusting the bit cell current bias can involve providing a dummy circuit that behaves in a manner similar to the bit cell and/or reference bit cell memory array. As mentioned, that control signal from the dummy circuit can provide specific levels for each memory word address, or alternatively, the memory array is subdivided into banks of neighboring memory words as in FIG. 8, and the amplitude of the control signal applied to the bit cell current bias control is caused to correspond by the ranking of the respective bank of neighboring word line addresses that contains the addressed memory word, in turn containing the bit cell to be read or written.

In the exemplary embodiments of magnetoresistive RAM magnetic tunnel junction MTJ elements, an objective is to adjust the current bias to the bit cells of an addressed memory word to account for a slope of an RH-ICELL resistance-current characteristic of the bit cell at least during memory read access. An example of that characteristic is shown in FIG. 3. The amplitude of the current bias control signal is advantageously normalized for all word line addresses, notwithstanding the body effect caused by the differing balance between bit line resistance BL_load and source line resistance SL_load, at different word line addresses. Such normalizing can amount to making the current bias conditions equal for all word line addresses to that only the variation of bit cell and reference cell resistances in nominal RH and RL resistance states is present at the inputs to the sensing circuit 25. Alternatively, the normalizing can amount merely to reducing the impact of the body effect on signal levels at the inputs to the sensing circuit compared to the signal levels without the benefit of the control signal adjustments.

In the examples shown and described, reading out the RH and RL states of the bit cells involves establishing one or more signals that are based on the serial resistance through the MTJ of a bit cell 22. Advantageously, resistance dependent signals are established from both a bit cell 22 and a reference bit cell 27 at a same word line address. The established signal level representing the bit cell resistance is compared against the comparable signal level from a reference. At least one of the bit cell (and in exemplary embodiments also the reference bit cell) can be in an RH resistance state, in which state the resistance of the bit cell varies with read bias current (see the house diagram in FIG. 3). The disclosed method comprises adjusting the read bias current level as a function of the body effect, namely variation in the balance of bit line and source line loading that varies read bias current as a function of word line address, to reduce or eliminate the variation in read bias current that is attributable to the body effect.

Therefore, as structured and operated, a magnetoresistive random access memory is provided with a memory array containing magnetoresistive bit cells 22 occupying bit positions in addressable word lines WL[n], each of the bit cells comprising at least one magnetic tunnel junction and a bit cell switching transistor 24 operable to couple the bit cell 22 between a bit line and a source line for an associated bit position during a read operation enabled by applying a drive signal to a clamping switching transistor. The bit line is thereby coupled to a sensing circuit, the bit line and the source line and the bit cell in series, leading to a current source for applying a reading current at a reading current amplitude to the bit cell when addressed at least during the read operation.

The bit line and the source line have characteristic resistances as a function of length, namely BL_load and SL_load, which vary inversely with one another but affect the current bias that the clamping switching transistor is able to apply, as a function of the word line position that is addressed. The bit cells 22 are coupled between the bit line BL and the source line SL at longer and shorter distances from the sensing circuit and the current source, as a function of a location in the array of addressable word line containing the bit cell in the array. The resistances BL_load and SL_load vary with the length of the BL and SL conductors, causing the body effect.

A sensing circuit 25 is operable to discern a logic value stored in the bit cell by detecting one of a relatively higher resistance RH state and a relatively lower resistance RL state of the bit cell while applying the reading current amplitude through the clamping switching transistor. In the examples, the sensing circuit compares signals developed as a function of resistance, for the addressed bit cell and for a reference bit cell. At least in some phases of that comparison, one or more of the addressed bit cell and the reference bit cell is in a high resistance RH state. At least the clamping reference switching transistor is coupled to a variable drive control signal Vbl_ref in FIG. 2, configured to supply a higher and lower drive signal as a function of the location of the word line WL[n] in the array.

Where the sensing circuit 25 compares inputs developed as a function of the resistances of a bit cell 22 and a reference bit cell 27, each containing at least one magnetoresistive MTJ element for each of the addressable word lines WL[n], the resistance states of the bit 22 cell and the reference bit cell 27 are determined by the sensing circuit so as to conclude whether the bit cell was at least initially in its high resistance or low resistance state. In the illustrated examples, reference bit cells 27 are provided with reference bit cell switching transistors and current bias controls that are the same as those of the data bit cells 22, including switching when addressed to couple the reference bit cell between a reference bit line and a reference source line during read operations and to carry a controlled read bias current from a reference clamping transistor. Both clamping transistors, namely for applying bias current to the bit cell and the reference bit cell, are coupled to the variable drive control configured to supply a higher and lower drive signal as a function of the location of the word line in the array, thereby reducing or eliminating the contribution of the body effect to introducing variations in bit cell and/or reference bit cell resistance when in the high resistance RH state.

Accordingly, a magnetoresistive memory apparatus as disclosed includes plural bit cells, each bit cell having at least one magnetoresistive element characterized by different resistances in different logic states of the bit cell, and each such bit cell occupies a bit cell position in a memory array having plural memory words. Each memory word is addressable by a word line signal during a memory access operation involving one of reading from and writing to bit cells in the memory word.

A read-write circuit for the bit cell position has one of an input and an output coupled to a bit line, and the bit cell is coupled between the bit line and a source line by at least one switching transistor when the bit cell is addressed during the memory access operation. Relative lengths of the bit line and the source line conductors in series with the bit cell vary oppositely, as a function of a location of the bit cell in the memory array. A drive control is coupled to vary an input to the switching transistor as a function of relative resistances of the relative lengths of the bit line and the source line. The memory access operation can be a read operation or a write operation.

The memory access operation can be a read operation and the input to the switching transistor can be adjusted to account for a slope of an RH-ICELL characteristic of the bit cell. Additionally, a reference bit cell can be provided at a word line address corresponding to a word line address of the bit cell, and a sensing circuit can be arranged to discern one of an RH state and RL state from a comparison of resistances of the bit cell and the reference bit cell.

The bit cells of the respective memory words in the illustrated examples are located at successive locations along generally parallel bit line and source line conductors and the switching transistor for each said bit cell couples the bit cell between the bit line and the source line at one of the successive locations. The exemplary memory operation is a read operation. The bit cells in the respective memory words are located at successive locations along generally parallel bit line and source line conductors. The switching transistor for each bit cell couples the bit cell between the bit line and the source line at one of the successive locations. The drive control is coupled to vary the drive voltage according to a relative location of the bit cell along the successive locations. The drive control can include a drive voltage adjustment circuit responsive to a word line address. For example, the drive voltage adjustment circuit can have a follower amplifier and a variable voltage source.

The variable voltage source can include a bit line voltage dummy circuit that produces a plurality of control voltages, and the variable voltage source in that cans can have a switching circuit for selecting among the plurality of control voltages. Advantageously, the plurality of control voltages can be assigned to word lines in banks having neighboring word line addresses. As such, the word lines in each of the banks are subjected to the same one of the plurality of control voltages when selected by a word line address signal.

In one embodiment, the drive control includes a current mirror circuit coupled to a reference current source, with a feedback current control configured to establish a nominal drive current amplitude in the bit line of the addressed bit cell substantially independently of the relative location of the bit cell along the successive locations.

This subject matter also entails a method for accessing bit cells in a memory array, particularly where the bit cells have distinct resistance levels representing logic states. The method includes configuring the memory array with bit cells arranged at bit position in memory words, so that each bit cell is coupleable by a switching transistor between a bit line and a source line at a location characterized by more or less resistance being associated with the bit line or the source line as a function of a location of an addressed memory word containing the bit cell. A control signal is applied at varying amplitude as a function of the location of the addressed memory word. The control signal is coupled to at least one of a clamping control, a memory access multiplex control, and a gate of the switching transistor, in a manner that at least reduces and potentially wholly offsets a body effect cause by more or less of the resistance being associated with the bit line or the source line, typically as said function of the location of the addressed memory word in the memory array.

In some embodiments, the control signal is derived from a numeric value such as the memory word address. In some embodiments, the control signal is derived from a variable voltage control having one of a current mirror and a feedback control leg operable to maintain a predetermined current characteristic through the addressed bit cell. For example, the same through-bit-cell current is established for all memory addresses.

The technique can be generalized to memory areas instead of customized to each word line position. For example, in some embodiments the memory array is subdivided into banks of neighboring memory words. The amplitude of the control signal is varied to correspond a ranking of one of the banks that contains the addressed memory word containing the bit cell.

In a magnetoresistive bit cell embodiment, the control signal can be varied to account for a slope of an RH-ICELL characteristic of the bit cell, at least during memory read access. In a magnetoresistive cell, the apparent resistance can vary with the amplitude of current through the cell. The control signal minimizes or corrects for discrepancies in resistance sensing by establishing a nominal current amplitude. The slope is non-zero in the RH resistance state, so the resistance of the bit cell can be compared accurately against that of a reference bit cell resistance at a same word line address, although one or both of the bit cell and the reference bit cell are in the RH resistance state.

A magnetoresistive random access memory as provided thus can include a memory array containing magnetoresistive bit cells occupying bit positions in addressable word lines, each of the bit cells comprising at least one magnetic tunnel junction and a bit cell switching transistor operable to couple the bit cell between a bit line and a source line for an associated bit position during a read operation enabled by applying a drive signal to a clamping switching transistor for coupling the bit line to a sensing circuit, the bit line and the source line leading to a current source for applying a reading current at a reading current amplitude to the bit cell when addressed at least during the read operation. The bit line and the source line have characteristic resistances as a function of length. The bit cells are coupled between the bit line and the source line at longer and shorter distances from the sensing circuit and the current source, as a function of a location in the array of addressable word line containing the bit cell in the array. A sensing circuit discerns a logic value stored in the bit cell by detecting one of a relatively higher resistance RH state and a relatively lower resistance RL state of the bit cell while applying the reading current amplitude through the clamping switching transistor. At least the clamping reference switching transistor is coupled to a variable drive control configured to supply a higher and lower drive signal as a function of the location of the word line in the array.

In some embodiments, a reference bit cell array is included. The reference bit cell array can contain at least one magnetoresistive reference bit cell for each of the addressable word lines, wherein resistances of the bit cell and the reference bit cell are compared by the sensing circuit, wherein the reference bit cell is coupled by a reference bit cell switching transistor operable to couple the reference bit cell between a reference bit line and a reference source line during read operations including operation of a reference clamping transistor. The reference bit cell array substantially resembles the bit cell array and is used for comparison. The reference clamping reference switching transistor is coupled to a variable drive control configured to supply a higher and lower drive signal as a function of the location of the word line in the array.

The foregoing discussion is directed to number of exemplary embodiments and examples. It should be understood, however, that the subject matter of this disclosure is capable of embodiment in other specific ways that are consistent with the examples as to pertinent aspects. The scope of this invention is not limited only the embodiments disclosed as examples. Reference should be made to the appended claims as opposed to the disclosure of examples, to assess the scope of the invention in which exclusive rights are claimed.

What is claimed is:

1. A magnetoresistive memory apparatus, comprising:
   plural bit cells, each bit cell having at least one magnetoresistive element characterized by different resistances in different logic states of the bit cell, and each said bit cell occupying a bit cell position in a memory array having plural memory words, each memory word being addressable by a word line signal during a memory access operation involving one of reading from and writing to bit cells in the memory word;
   a read-write circuit for the bit cell position, the read/write circuit having one of an input and an output coupled to a bit line, and the bit cell being coupled between the bit line and a source line by at least one switching transistor when the bit cell is addressed during the memory access operation, wherein relative resistances of the bit line and the source line vary oppositely as a function of a location of the bit cell in the memory array;
   a drive control coupled to vary an input to the switching transistor as a function of the relative resistances of the bit line and the source line to offset a body effect caused by the location of the bit cell in the memory array.

2. The memory apparatus of claim 1, wherein the memory access operation is a read operation and the input to the switching transistor is adjusted to account for a slope of an RH-ICELL characteristic of the bit cell.

3. The memory apparatus of claim 2, further comprising a reference bit cell at a word line address corresponding to a word line address of the bit cell, and a sensing circuit arranged to discern one of an RH state and RL state from a comparison of resistances of the bit cell and the reference bit cell.

4. The memory apparatus of claim 1, wherein the memory access operation is a write operation.

5. The memory apparatus of claim 1, wherein the bit cells in the respective memory words are located at successive locations along generally parallel bit line and source line conductors and the switching transistor for each said bit cell couples the bit cell between the bit line and the source line at one of the successive locations.

6. The memory apparatus of claim 1, wherein the memory operation is a read operation, wherein the bit cells in the respective memory words are located at successive locations along generally parallel bit line and source line conductors, wherein the switching transistor for each said bit cell couples the bit cell between the bit line and the source line at one of the successive locations, and wherein the drive control is coupled to vary the drive voltage according to a relative location of the bit cell along the successive locations.

7. The memory apparatus of claim 6, wherein the drive control comprises a drive voltage adjustment circuit responsive to a word line address.

8. The memory apparatus of claim 6, wherein the drive voltage adjustment circuit comprises a follower amplifier and a variable voltage source.

9. The memory apparatus of claim 6, wherein the variable voltage source comprises a bit line voltage dummy circuit.

10. The memory apparatus of claim 9, wherein the bit line voltage dummy circuit produces a plurality of control voltages and the variable voltage source further comprises a switching circuit for selecting among the plurality of control voltages.

11. The memory apparatus of claim 10, wherein the plurality of control voltages are assigned to word lines in banks having neighboring word line addresses, whereby the word lines in each of the banks are subjected to the same one of the plurality of control voltages when selected by a word line address signal.

12. A magnetoresistive memory apparatus, comprising:
plural bit cells, each bit cell having at least one magnetoresistive element characterized by different resistances in different logic states of the bit cell, and each said bit cell occupying a bit cell position in a memory array having plural memory words, each memory word being addressable by a word line signal during a memory access operation involving one of reading from and writing to bit cells in the memory word;
a read-write circuit for the bit cell position, the read/write circuit having one of an input and an output coupled to a bit line, and the bit cell being coupled between the bit line and a source line by at least one switching transistor when the bit cell is addressed during the memory access operation, wherein relative lengths and resistances of the bit line and the source line vary oppositely as a function of a location of the bit cell in the memory array;
a drive control coupled to vary an input to the switching transistor as a function of the relative resistances of the bit line and the source line to offset a body effect caused by the location of the bit cell in the memory array, wherein the drive control comprises a current mirror circuit coupled to a reference current source, and a feedback current control configured to establish a nominal drive current amplitude in the bit line of the addressed bit cell substantially independently of the relative location of the bit cell along the successive locations.

13. A method for accessing bit cells in a memory array wherein the bit cells have distinct resistance levels representing logic states, comprising:
configuring the memory array with bit cells arranged at bit position in memory words, each bit cell being coupleable by a switching transistor between a bit line and a source line at a location characterized by more or less resistance being associated with the bit line or the source line as a function of a location of an addressed memory word containing said bit cell;
providing a control signal that varies in amplitude as a function of the location of the addressed memory word;
coupling and setting the control signal to at least one of a clamping control, a memory access multiplex control, and a gate of the switching transistor, so as to at least reduce a body effect caused by said more or less resistance being associated with the bit line or the source line as said function of the location of the addressed memory word.

14. The method of claim 13, comprising deriving the control signal from a numeric value of an address of the memory word.

15. The method of claim 13, comprising deriving the control signal from a variable voltage control having one of a current mirror and a feedback control leg operable to maintain a predetermined current characteristic through the addressed bit cell.

16. The method of claim 13, comprising subdividing the memory array into banks of neighboring memory words, and varying the amplitude of the control signal to correspond a ranking of one of the banks that contains the addressed memory word containing said bit cell.

17. The method of claim 13, comprising varying the control signal to account for a slope of an RH-ICELL characteristic of the bit cell at least during memory read access.

18. The method of claim 17, further comprising comparing a resistance of the bit cell to a reference bit cell resistance at a same word line address, and wherein at least one of the bit cell and the reference bit cell can be in an RH resistance state.

19. A magnetoresistive random access memory, comprising:
a memory array containing magnetoresistive bit cells occupying bit positions in addressable word lines, each of the bit cells comprising at least one magnetic tunnel junction and a bit cell switching transistor operable to couple the bit cell between a bit line and a source line for an associated bit position during a read operation enabled by applying a drive signal to a clamping switching transistor for coupling the bit line to a sensing circuit, the bit line and the source line leading to a current source for applying a reading current at a reading current amplitude to the bit cell when addressed at least during the read operation;
wherein the bit line and the source line have characteristic resistances as a function of length, and the bit cells are coupled between the bit line and the source line at longer and shorter distances from the sensing circuit and the current source, as a function of a location in the array of addressable word line containing the bit cell in the array;
a sensing circuit operable to discern a logic value stored in the bit cell by detecting one of a relatively higher resistance RH state and a relatively lower resistance RL state of the bit cell while applying the reading current amplitude through the clamping switching transistor;
wherein at least the clamping reference switching transistor is coupled to a variable drive control configured to supply a higher and lower drive signal as a function of the location of the resistance of the source line of the bit cell in the array.

20. The magnetoresistive random access memory of claim 19, further comprising a reference bit cell array containing at least one magnetoresistive reference bit cell for each of the addressable word lines, wherein resistances of the bit cell and the reference bit cell are compared by the sensing circuit, wherein the reference bit cell is coupled by a reference bit cell switching transistor operable to couple the reference bit cell between a reference bit line and a reference source line during read operations including operation of a reference clamping transistor; and,
wherein, the reference clamping reference switching transistor is coupled to a variable drive control configured to supply a higher and lower drive signal as a function of the location of the word line in the array.

\* \* \* \* \*